United States Patent
Cao et al.

(10) Patent No.: US 11,604,418 B2
(45) Date of Patent: Mar. 14, 2023

(54) MULTI-CHANNEL DEVICE AND METHOD FOR MEASURING DISTORTION AND MAGNIFICATION OF OBJECTIVE LENS

(71) Applicant: Shanghai Institute of Optics And Fine Mechanics, Chinese Academy of Sciences, Shanghai (CN)

(72) Inventors: Yisha Cao, Shanghai (CN); Feng Tang, Shanghai (CN); Xiangzhao Wang, Shanghai (CN); Yang Liu, Shanghai (CN); Yunjun Lu, Shanghai (CN)

(73) Assignee: Shanghai Institute of Optics And Fine Mechanics, Chinese Academy of Sciences, Shanghai (CN)

( * ) Notice: Subject to any disclaimer, the term of this patent is extended or adjusted under 35 U.S.C. 154(b) by 0 days.

(21) Appl. No.: 17/547,179

(22) Filed: Dec. 9, 2021

(65) Prior Publication Data
US 2022/0365441 A1 Nov. 17, 2022

(30) Foreign Application Priority Data
May 7, 2021 (CN) .......................... 202110496405.9

(51) Int. Cl.
*G03F 7/20* (2006.01)
*G03F 1/44* (2012.01)
*G03F 1/42* (2012.01)

(52) U.S. Cl.
CPC ................ *G03F 7/706* (2013.01); *G03F 1/42* (2013.01); *G03F 1/44* (2013.01); *G03F 7/7085* (2013.01)

(58) Field of Classification Search
CPC ........ G03F 7/706; G03F 7/70; G03F 7/70591; G03F 7/7085; G03F 7/70516;
(Continued)

(56) References Cited

U.S. PATENT DOCUMENTS

| | | | | |
|---|---|---|---|---|
| 2002/0041377 A1* | 4/2002 | Hagiwara | ............... | G03F 7/706 356/399 |
| 2002/0118349 A1* | 8/2002 | Yang | ......................... | G06T 7/73 355/55 |
| 2004/0169866 A1* | 9/2004 | Poultney | .............. | G02B 5/1838 356/521 |
| 2007/0002293 A1* | 1/2007 | Park | ....................... | G03F 7/706 430/394 |

(Continued)

FOREIGN PATENT DOCUMENTS

| | | | | |
|---|---|---|---|---|
| CN | 102466977 | A | * | 5/2012 |
| CN | 102540751 | A | * | 7/2012 |
| CN | 105890875 | A | * | 8/2016 |

OTHER PUBLICATIONS

English translation of CN 102466977, published May 23, 2012. (Year: 2012).*

(Continued)

*Primary Examiner* — Christina A Riddle
(74) *Attorney, Agent, or Firm* — Mei & Mark LLP; Manni Li (57) ABSTRACT

A multi-channel device and method for measuring the distortion and magnification of objective lens. The multi-channel device for measuring the distortion and magnification of objective lens comprises an illumination system, a reticle stage, a test reticle, a projection objective lens, a wafer stage and a multi-channel image plane sensor, wherein the multi-channel image plane sensor simultaneously measures the image placement shifts between actual image points and nominal image points after a plurality of object plane test marks are imaged by the projection objective lens, and calculates the distortion and magnification errors of the objective lens by fitting, which shortens the measurement time, eliminates the influence of wafer stage errors on the measurement accuracy and improves the measurement accuracy.

9 Claims, 4 Drawing Sheets

(58) Field of Classification Search
CPC ............ G03F 7/70275; G03F 7/70258; G03F 7/70283; G03F 7/70316; G03F 7/70375; G03F 7/70483–70541; G03F 7/7055; G03F 7/70558; G03F 7/70666; G03F 7/70683; G03F 7/708; G03F 7/70808; G03F 7/70825; G03F 7/70833; G03F 7/70858; G03F 7/70883; G03F 7/70891; G03F 7/70975; G03F 1/42; G03F 1/44; G03F 1/38; G03F 1/82; G03F 1/84; G03F 1/68; G01M 11/0242; G01M 11/0271
USPC ................... 355/18, 30, 52–55, 67–77, 133; 356/399–401

See application file for complete search history.

(56) References Cited

U.S. PATENT DOCUMENTS

| | | | | |
|---|---|---|---|---|
| 2010/0190115 A1* | 7/2010 | Kato | .................... | G03F 7/706 430/325 |
| 2015/0286153 A1* | 10/2015 | Kok | .................. | G01B 11/0675 356/498 |

OTHER PUBLICATIONS

English translation of CN 102540751, published Jul. 4, 2012. (Year: 2012).*
English translation of CN 105890875, published Aug. 24, 2016. (Year: 2016).*

* cited by examiner

MULTI-CHANNEL DEVICE AND METHOD FOR MEASURING DISTORTION AND MAGNIFICATION OF OBJECTIVE LENS

CROSS-REFERENCE TO RELATED APPLICATIONS

The subject application claims priority to Chinese Patent Application No. 202110496405.9 filed on May 7, 2021, in China. The Chinese priority application is incorporated herein by reference.

TECHNICAL FIELD

The invention relates to lithography, and particularly, a multi-channel device and method for measuring distortion and magnification of objective lens.

BACKGROUND ART

The distortion of the lithography projection objective lens is one of the most important factors affecting the overlay accuracy of a lithography machine. The distortion causes the transverse magnification of the objective lens to change with the increase of field of view. The pattern exposed to the silicon wafer is displaced relative to its ideal position, causing overlay errors. In order to control the imaging quality of the projection objective lens, it is necessary to measure and optimize the distortion during the assembly and use of the objective lens. High-precision image quality measurement technology is required. Off-line measurement of imaging quality is conducted in the stage of integration and assembly of the projection objective lens. In the use of the objective lens, the imaging quality is measured in situ. According to the measurement results, the aberration can be compensated by adjusting the movable lens of the projection objective to improve the imaging quality.

The principle for measuring the distortion of the lithographic projection objective is accurately measuring the deviation between the actual imaging position and the nominal imaging position of a set of object-surface test marks imaged by the projection objective. Then the least square method is used to fit the distortion and magnification error of the projection objective. According to the different methods of obtaining the image placement shifts of the object-plane test marks, the distortion measurement technology of the lithography projection objective lens can be divided into three categories: exposure measurement, aerial image measurement and wavefront measurement.

The prior art CN102466977B proposes a distortion measurement device based on exposure, which comprises an illumination system, a reticle stage, a reticle, a projection objective lens, a wafer stage, and a wafer. The method of measuring distortion is to expose two layers reticle pattern on the wafer. Then measure the overlay error and fit the distortion. When the first layer is exposed, the measurement mark array on the reticle is exposed to the wafer through the entire field of the projection objective lens, and the actual imaging position of the mark is affected by distortion. When the second layer is exposed, the illumination area is limited to a small area on the reticle so that only the marks in the central field are illuminated. The wafer stage is moved to the nominal imaging position of the first-layer exposure pattern in turn to expose the pattern of the second layer. And make the small squares of the second-layer pattern coincide with the nominal imaging positions of the large squares exposed in the first layer to form an ooverlay mark. Since each mark of the second layer is exposed by the mark in the central field, the actual imaging position is not affected by distortion. Therefore, the overlay error is the distortion. The disadvantage of this method is that the fitting result will be affected by the error of the wafer stage. When the second layer is exposed, the positioning error of the wafer stage is different for each field. In order to achieve the fitting, it is usually assumed that the errors of the wafer stage in each field of the second layer exposure pattern are the same. Therefore, different wafer stage errors will be manifested in the fitting value of distortion, and the fitting result are inaccurate. In addition, the accuracy of distortion measurement is also limited by the accuracy of overlay error measurement.

US20020041377A1 discloses a distortion measurement technology based on aerial images. In the distortion measurement method, an aerial image sensor is placed on the wafer plane, scan the aerial image of each measurement mark in turn. Determine the actual imaging positions of all the aerial images, and obtain the distortion by fitting. In the technology, the aerial image sensor needs to be moved to measure the aerial image position of each measurement mark in turn. The positioning error of the wafer stage is different during each measurement so it is impossible to calculate the distortion through fitting. To achieve fitting, it is usually assumed that the positioning error of the wafer stage is always the same, so the distortion obtained by fitting is inaccurate. The accuracy of the technology is affected by the positioning error of the wafer stage.

CN102540751A discloses a distortion measurement technology based on wavefront measurement. In the method, a reticle containing a pinhole array is mounted on a reticle stage and a Hartmann sensor on a wafer stage. An ideal wavefront is generated after a light source passes through pinholes. A wavefront to be measured after the ideal wavefront passes through a projection objective lens carries aberration. The wavefront to be measured is collimated by a collimating lens and received by the Hartmann sensor. The Hartmann sensor is aligned with an aerial image of each pinhole mark to test its wavefront aberration. According to Z2-Z4 terms of the wavefront aberration measured by the Hartmann sensor, the actual imaging point positions of the pinhole marks can be calculated and the distortion can be obtained by fitting. The distortion measurement accuracy of the technology is also affected by positioning error of the wafer stage.

The accuracy of all three distortion measurement techniques mentioned above is affected by positioning error of the wafer stage, which may cause low measuring speed, complicated testing steps, or a failure in measuring the wavefront aberration and distortion of the projection objective lens at the same time. Moreover, these techniques can not measure the positioning error of the wafer stage.

SUMMARY OF THE INVENTION

The invention aims to provide a multi-channel device and method for measuring distortion and magnification of objective lens. The technical solution of the invention is as follows.

In the first aspect, the invention provides a multi-channel device and method for measuring distortion and magnification of objective lens, comprising: an illumination system used for providing a light source; a reticle stage used for bearing a test reticle; a test reticle containing A (A>=1) groups of object plane test marks, wherein each group has G (G>=3) object plane test marks, the G object plane test marks in each group have the same spacing p and spatial distribution, and are arranged along a straight line, a broken line or into an array according to the spacing p, the spacing between different groups is >=p; projection objective lens used for imaging the object plane test marks; a multi-channel image plane sensor used for simultaneously measuring the image placement shifts between actual image points and nominal image points after the plurality of object plane test marks are imaged by the projection objective lens, wherein the multi-channel image plane sensor comprises a group of G image plane test marks in conjugate relation with a group of G object plane test marks, and a flat-panel measurer, and the image plane test marks and the flat-panel measurer are sequentially placed along the light transmission direction; the spacing p' between the G image plane test marks is equal to M×p, where M is the nominal reduction magnification of the projection objective lens; the divergent light transmission distance between the flat-panel measurer and the plane where the image plane test marks are located is $$q, q < \frac{p'}{2NA},$$

so that optical signals of different marks on the flat-panel measurer of the multi-channel image plane sensor do not interfere with each other; and a wafer stage used for bearing the multi-channel image plane sensor.

In the present invention, the multi-channel image plane sensor is a multi-channel point diffraction interference sensor, a multi-channel Shack-Hartmann sensor, or a multi-channel shearing interference sensor.

In the present invention, the multi-channel point diffraction interference sensor comprises image plane test marks, a collimating lens array and an flat-panel measurer. Each object plane test mark comprises two pinhole marks, and the image plane test mark comprises a pinhole mark and an window; the collimating lens array comprises G collimating lenses, and the front focal plane of the collimating lens array is located on the plane where the image plane test marks are located; and the flat-panel measurer is a charged-coupled device (CCD), a photosensitive surface of the flat-panel measurer is located on the back focal plane of the collimating lens array, the focal lengths of the G collimating lenses are equal, which is $f_1$, and $$f_1 < \frac{p'}{2NA},$$

so that the optical signals of different marks on the flat-panel measurer of the multi-channel image plane sensor do not interfere with each other.

In the present invention, the multi-channel Shack-Hartmann sensor comprises image plane test marks, a collimating lens array, a microlens array and an flat-panel measurer, each object plane test mark is a pinhole mark, the image plane test marks are windows, the collimating lens array comprises G collimating lenses, and the front focal plane of the collimating lens array is located on a plane in conjugate relation with the object plane test marks; the flat-panel measurer is a complementary metal-oxide-semiconductor (CMOS), the microlens array is located on the back focal plane of the collimating lens array, and the photosensitive surface of the flat-panel measurer is located on the focal plane of the microlens array; and the focal lengths of the G collimating lenses are equal, which is $f_2$, and $$f_2 < \frac{p'}{2NA},$$

so that the optical signals of different marks on the flat-panel measurer of the multi-channel Shack-Hartmann sensor do not interfere with each other.

In the present invention, the multi-channel shearing interference sensor comprises image plane test marks and an flat-panel measurer; each object plane test mark comprises two one-dimensional gratings in orthogonal directions, namely a first direction and a second direction, the one-dimensional gratings in the first direction and the second direction are used to measure the image placement shifts in the x direction and the y direction respectively, and the two directions share the same grating size and grating period; the image plane test marks are checkerboard gratings which are located on a plane in conjugate relation with the object plane test marks, and the flat-panel measurer is a CCD located on the side of the checkerboard grating away from the projection objective lens; and the distance between the plane where the checkerboard gratings are located and the photosensitive surface of the flat-panel measurer is $$q, q < \frac{p'}{2NA},$$

so that the optical signals of different marks on the flat-panel measurer of the multi-channel shearing interference plane sensor do not interfere with each other.

In the second aspect, the invention also provides a multi-channel method for measuring distortion and magnification of objective lens, which adopts the multi-channel device for testing the distortion and magnification of the objective lens for testing, and comprises the following steps:

step 1, mounting the test reticle on the reticle stage, and moving the object plane test marks into the field of the projection objective lens;

step 2, mounting the multi-channel image plane sensor on the wafer stage and moving the same to the plane in conjugate relation with the object plane test marks;

step 3, using the illumination system to image the object plane test marks through the projection objective lens, using the multi-channel image plane sensor to simultaneously measure the image placement shifts ($\Delta x_i$, $\Delta y_i$) (I=1, i=1–G) after the first group of G object plane test marks are imaged by the projection objective lens, and moving the field to measure the image placement shifts of the next group of object plane test marks; wherein the image placement shifts of G channels can be measured each time, and there are two ways to move the field: a, changing the setting of the illumination system so that the illumination light emitted by the illumination system only illuminates the second group of G object plane test marks, and moving the wafer stage to make the multi-channel image plane sensor simultaneously measure the image placement shifts ($\Delta x_i, \Delta y_i$) (I=2, i=1–G) after the second group of G object plane test marks are imaged by the projection objective lens; and so on, until the image placement shifts ($\Delta x_i, \Delta y_i$) (I=1–A, i=1–G) of N object plane test marks which are divided into A groups are measured; and b, moving the reticle stage to change the position of a field point where the object plane test marks are located, and moving the wafer stage to make the multi-channel image plane sensor simultaneously measure the image placement shifts $(\Delta x_i, \Delta y_i)$ (I=2, i=1–G) again after the first group of G object plane test marks are imaged by the projection objective lens; and so on, until the image placement shifts $(\Delta x_i, \Delta y_i)$ of the object plane test marks at all field points are measured;

step 4, calculating the distortion and magnification errors of the projection objective lens by conducting least square fitting on $(\Delta x_i, \Delta y_i)$ as follows:

$$\Delta x_i = T_{Ix} - \theta_{Ix} y_i + M_x x_i - k_1 x_i r_i^2 + r_x \quad (1)$$
$$\Delta y_i = T_{Iy} + \theta_{Iy} x_i + M_y y_i - k_1 y_i r_i^2 + r_y,$$

where $T_{Ix}$ and $T_{Iy}$ are the translation errors of the wafer stage (900) when the multi-channel image plane sensor (600) is used to measure the x-direction and y-direction image placement shifts of the I<th> (I=1, 2 ... A) group of object plane test marks (300) respectively, $\theta_{Ix}$ and $\theta_{Iy}$ are the rotation errors of the wafer stage (900) when the multi-channel image plane sensor (600) is used to measure the x-direction and y-direction image placement shifts of the I<th> (I=1, 2 ... A) group of object plane test marks (300) respectively, $M_x$ and $M_y$ are the magnification errors of the projection objective lens (500) in x and y directions, $r_i = \sqrt{x_i^2 + y_i^2}$ is the distance from a nominal imaging position of the i<th> object surface test mark (300) to the center of the image plane coordinate system, $k_1$ is the third-order distortion coefficient of the projection objective lens (500), $r_x$ and $r_y$ are fitting residuals, (xi, yi) is the nominal imaging position of the i<th> (i=1, 2 ... G) object surface test mark (300) in the I<th> group, and the formula is as follows:

$$(x_i, y_i) = (xx_i, yy_i) \cdot M \quad (2)$$

where $(xx_i, yy_i)$ is the position of the object surface test mark (300) in an object plane coordinate system. For N object plane test marks, there are 2N equations, and the required unknowns are the wafer stage errors $(T_{Ix}, \theta_{Ix}, T_{Iy}, \theta_{Iy})$ (I=1–A) and the third-order distortion and magnification errors $(k_I, M_x, M_y)$ of a group of projection objective lenses during multi-channel measurement. Let the number of unknowns of the equation set (1) be H, 3A+3<=H<=4A+3, when the number of equations of the equation set (1) is greater than or equal to the lower limit of H, that is, when the formula (3) is satisfied, the fitting of the third-order distortion coefficient and magnification error parameters of the measured projection objective lens can be realized.

$$2N = 2AG \geq 3A + 3 \quad (3)$$
$$G \geq \frac{3}{2} + \frac{3}{2A},$$

where G>=3 because A>=1.

In step 3, the steps to test the image placement shifts $(\Delta x_i, \Delta y_i)$ i=1–G) are different for different multi-channel image plane sensors.

The testing steps for a multi-channel point diffraction interference sensor are as follows: the illumination light source generates 2G ideal spherical waves after passing through the first group of G double pinholes on the object plane test reticle, the ideal spherical waves are imaged by the projection objective lens to form 2G measured wavefronts, and the wafer stage is moved; when the G image space pinhole marks of the multi-channel point diffraction interference sensor are approximately aligned with the nominal imaging positions of the G object plane pinholes, the position $[X_I, Y_I]$ (I=1) of the wafer stage at this point is recorded; one path (G) of the 2G measured wavefronts is diffracted by the G image plane pinhole marks to form ideal spherical waves to be used as reference lights, and one path (G) passes through the window to be used as measurement lights; the G measurement lights and the G reference lights interfere and are collimated by the G collimating lenses to form G interference fringes on the CCD, the interference fringes are analyzed to obtain the wavefront aberrations of a first group of G field points, and the alignment deviation $(\delta x_i, \delta y_i, \delta z_i)$ of a first group of G pinholes is calculated according to the Zernike coefficients of $Z_2$-$Z_4$ terms of the measured G wavefront aberrations based on the formula (4) as follows:

$$\delta x_i = f_1 \times \frac{Z_2}{R_{sensor}} \quad (4)$$
$$\delta y_i = f_1 \times \frac{Z_3}{R_{sensor}}$$
$$\delta z_i = -16 f_1 Z_4^2 / R_{sensor}^4,$$

where $R_{sensor}$ is the wavefront radius measured by the CCD, and $(\delta x_i, \delta y_i, \delta z_i)$ is the position deviation between an actual image point of each pinhole mark in the first group and a reference point (the focal point of the collimating lens of the point diffraction interference sensor); after calculating $(\delta x_i, \delta y_i, \delta z_i)$, the position of the reference point (the nominal imaging position $(x_i, y_i)$ of each pinhole mark plus the position $[X_I, Y_I]$ (I=1) of the wafer stage) is added to obtain the actual imaging point position $(x_{ri}, y_{ri}, z_{ri})$ of each pinhole mark in the first group; the nominal imaging position $(x_i, y_i)$ of the object plane pinhole marker is calculated by formula (2), then the formula for calculating the image placement shifts $(\Delta x_i, \Delta y_i)$ (I=1, i=1–G) of the first group of G object surface pinhole markers is:

$$(\Delta x_i, \Delta y_i) = (x_{ri}, y_{ri}) - (x_i, y_i) \quad (5)$$

, and the field is moved to measure the image placement shifts $(\Delta x_i, \Delta y_i)$ (I=2, i=1–G) of the next group of object plane pinholes according to the above method until the image placement shifts $(\Delta x_i, \Delta y_i)$ (I=1–A, i=1–G) of N object plane test marks which are divided into A groups are measured.

The testing steps for a multi-channel Shack-Hartmann sensor are as follows: the light emitted by the illumination system passes through the first group of G object plane pinholes to form G ideal spherical waves, which are imaged by the projection objective lens to form G measured wavefronts, and the multi-channel Shack-Hartmann sensor is moved until the front focal points of the G collimating lenses and the nominal imaging positions of the G object plane pinholes are aligned; the G measured wavefronts are collimated by the G collimating lenses in the multi-channel Shack-Hartmann wavefront sensor, each collimated wavefront is focused on the CMOS by the microlens array to form an image point array, and the wavefront aberrations of G field points are obtained by analyzing the coordinates of an image point array of the G field points; using the same calculation principle as the multi-channel point diffraction interference sensor, the alignment position deviation $(\delta x_i, \delta y_i, \delta z_i)$ and image placement shifts $(\Delta x_i, \Delta y_i)$ (I=1, i=1–G) of the first group of G pinholes are calculated according to formulas (2), (4) and (5) based on the Zernike coefficients of Z2-Z4 terms of the measured G wavefront aberrations, where $f_1$ in the formula is replaced by $f_2$; the alignment deviation is the position deviation between an actual image point of each pinhole mark in the first group and a reference point (a focal point of the collimating lens of the Shack-Hartmann wavefront sensor); and the image placement shifts $(\Delta x_i, \Delta y_i)$ (I=2, i=1–G) of the next group of object plane pinholes are measured according to the above method until the image placement shifts $(\Delta x_i, \Delta y_i)$ (I=1–A, i=1–G) of N object plane test marks which are divided into A groups are measured.

The testing steps for a multi-channel shearing interference sensor are as follows:

(1) obtaining interference images (I=1, i=1–G) of the first group of G object plane test marks:

(a) testing a first group of G first-direction interference images to obtain a differential wavefront: the wafer stage is moved to align the G checkerboard gratings with the nominal imaging positions of G first-direction one-dimensional gratings in the first group of object plane gratings, and the position $[X_{f1}, Y_{f1}]$ (I=1) of the wafer stage at this point is recorded; an incoherent light source uniformly illuminates the G one-dimensional grating in the first direction on an object plane; the one-dimensional grating modulates the spatial coherence of a light field and enables a pupil of the projection objective lens to be uniformly illuminated; the checkerboard gratings on an image plane are used as beam splitting elements to make each diffraction order dislocated, G shearing interference images in the first direction are formed on the CCD after diffraction light of the 0<th> order interferes with diffraction light of other odd orders, and no interference occurs among other diffraction orders; a phase shift algorithm is used to solve the first group of G first-direction interference images to obtain a differential wavefront;

(b) testing a first group of G second-direction interference images to obtain a differential wavefront: the wafer stage is moved to align the G checkerboard gratings with the nominal imaging positions of G second-direction gratings in the first group, and the position $[X_{f2}, Y_{f2}]$ (I=1) of the wafer stage at this point is recorded; shearing interference images of G second-direction gratings are formed on the CCD; a phase shift algorithm is used to solve the first group of G second-direction interference images to obtain a differential wavefront;

(2) calculating the image placement shifts $(\Delta x_i, \Delta y_i)$ (I=1, i=1–G) of the first group of G object plane test marks: the wavefront aberration of the measured projection objective lens is obtained by wavefront reconstruction, the distortion is obtained from the Zernike coefficients of the $Z_2$-$Z_3$ terms, and the alignment position deviation $(\delta x_i, \delta y_i)$ (I=1, i=1–G) based on the shearing interference is calculated by the formula (6):

$$\delta x_i = \frac{a_2 s}{\lambda} \times P \qquad (6)$$
$$\delta y_i = \frac{a_3 s}{\lambda} \times P,$$

the alignment position deviation $\delta x_i, \delta y_i$ is the deviation between the positions of the G checkerboard gratings and the actual imaging positions of the first group of G object plane test marks, where P is the period of the checkerboard gratings, a2, a3 are the Zernike coefficients of the $Z_2$-$Z_3$ terms, the unit is wavelength $\lambda$, and s is the normalized shear amount; the positions $[X_{f1}, Y_{f1}]$ (I=1) and $[X_{f2}, Y_{f2}]$ (I=1) of the wafer stage are added with the nominal imaging positions $(x_i, y_i)$ of the first group of G object plane test marks to obtain the actual imaging positions $(x_{ri}, y_{ri})$ of the first group of G object plane test marks; the image placement shifts $(\Delta x_i, \Delta y_i)$ (I=1, i=1–G) of the first group of G object plane test marks are calculated according to formula (5);

(3) calculating the image placement shifts $(\Delta x_i, \Delta y_i)$ (I=2–A, i=1–G) of the G object plane test marks in the I<th> group (I=2–A):

the image placement shifts $(\Delta x_i, \Delta y_i)$ (I=2–A, i=1–G) of the next group of object plane test marks are measured according to (1) and (2) until the image placement shifts $(\Delta x_i, \Delta y_i)$ (I=1–A, i=1–G) of N object plane test marks which are divided into A groups are measured.

Fitting of the image placement shifts $(\Delta x_i, \Delta y_i)$ (I=1–A, i=1–G) is conducted according to the following formula:

$$\Delta x_i = T_{Ix} - \theta_{Ix} y_i + M_x x_i - k_1 x_i r_i^2 + r_x \qquad (1)$$
$$\Delta y_i = T_{Iy} + \theta_{Iy} x_i + M_y y_i - k_1 y_i r_i^2 + r_y,$$

where $T_{Ix}, \theta_{Ix}, T_{Iy}, \theta_{Iy}$ are the translation and rotation errors of the wafer stage when the chessboard gratings are aligned with the G first-direction one-dimensional gratings and second-direction one-dimensional gratings of the I<th> group. N object plane test marks generate 2N equations, and the number of unknowns is 4A+3. When the number of equations is greater than or equal to the number of unknowns, that is, $$2N = 2AG >= 4A + 3 \qquad (3)$$
$$G >= 2 + \frac{3}{2A},$$

fitting can be realized, G>=3.5 because A>=1, and G>=4 because G is an integer. The invention has the beneficial effects that first, the accuracy of distortion measurement is not affected by the positioning error of the wafer stage; second, measuring speed is high; third, testing steps are simple; fourth, the wavefront aberration and distortion of the projection objective lens can be measured simultaneously; and fifth, the positioning error of the wafer stage can be measured.

DETAILED DESCRIPTION OF THE INVENTION

The method for measuring the distortion and magnification of a multi-channel objective lens according to the present invention is described in further detail with reference to the preferred embodiments.

Figure 1:
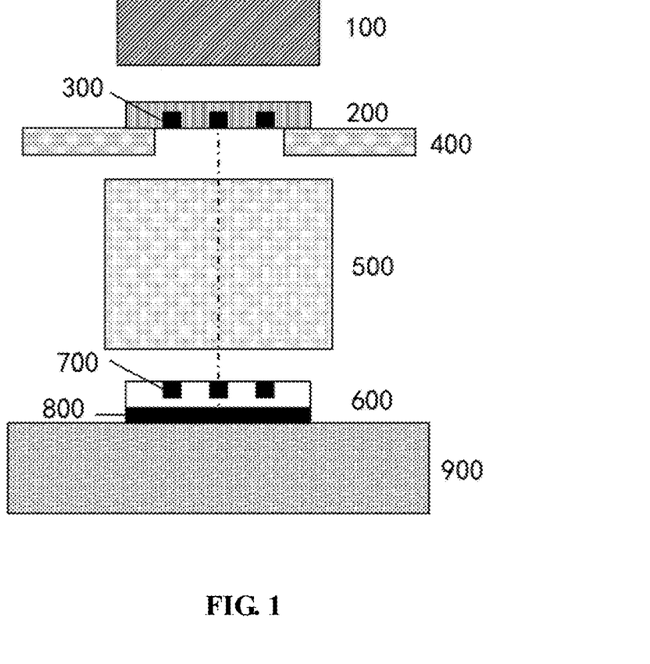
FIG. 1 shows the multi-channel device for measuring the distortion and magnification of a objective lens in the present invention.

As shown in FIG. 1, the multi-channel device for measuring the distortion and magnification of a objective lens of the present invention comprises an illumination system 100, a test reticle 200, a reticle stage 400, a projection objective lens 500, a multi-channel image plane sensor 600 and a wafer stage 900. The illumination system 100 is used for providing a light source; the test reticle 200 is mounted on the reticle stage 400, the lower surface of the test reticle 200 makes contact with the upper surface of the reticle stage 400, and the lower surface of the test reticle 200 contains a number of groups of object plane test marks 300 (where the number of groups is A and the number of object plane test marks within a group is G, and A=1 and G=3), which are arranged along a straight line with an interval p; the projection objective lens 500 is used for imaging the object plane test marks 300; there are a distance between the reticle stage 300 and the projection objective lens 500 and a distance between the projection objective lens 500 and the multi-channel image plane sensor 600; the multi-channel image plane sensor 600 is mounted on the wafer stage 900 and used for simultaneously measuring the image placement shifts between actual image points and nominal image points after the plurality of object plane test marks 300 are imaged by the projection objective lens 500; the multi-channel image plane sensor 600 comprises 3 image plane test marks 700 in conjugate relation with the object plane test marks 300, and an flat-panel measurer 800, and the image plane test marks 700 and the flat-panel measurer 800 are sequentially placed along the light transmission direction; the spacing p' between the image plane test marks 700 is equal to p×M; the divergent light transmission distance between the flat-panel measurer 800 and a plane where the image plane test marks 700 are located is $$q, q < \frac{p'}{2NA},$$

so that optical signals of different marks on the flat-panel measurer 800 of the multi-channel image plane sensor 600 do not interfere with each other; and the wafer stage 900 is used for carrying the multi-channel image plane sensor 600.

Figure 2:
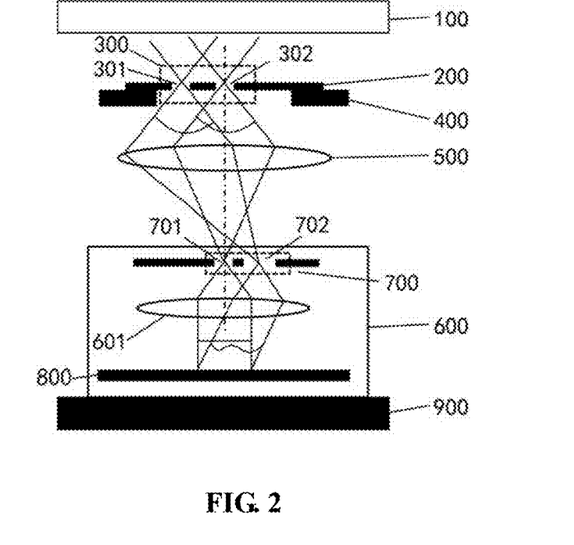
FIG. 2 shows the device for measuring the distortion and magnification of a projection objective lens based on a multi-channel point diffraction interference sensor in the first embodiment of the present invention.
Figure 3:
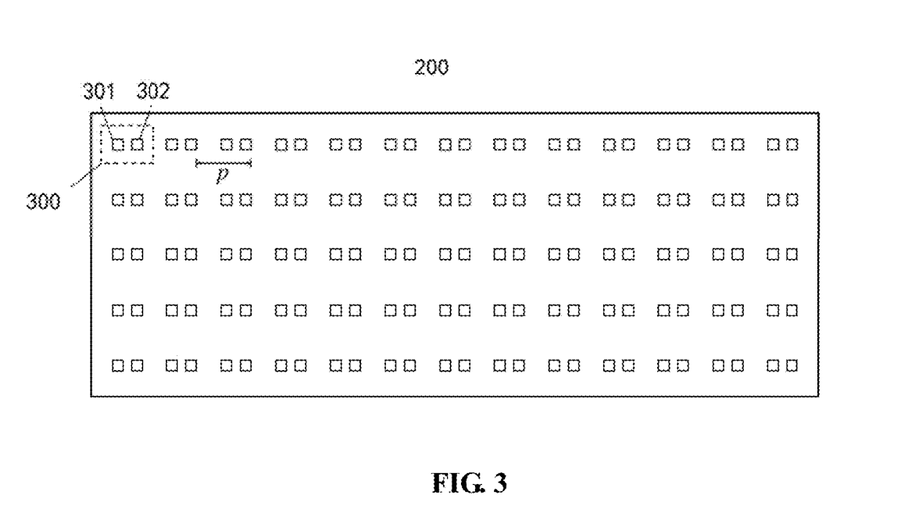
FIG. 3 shows the test reticle in the first embodiment of the present invention.
Figure 4:
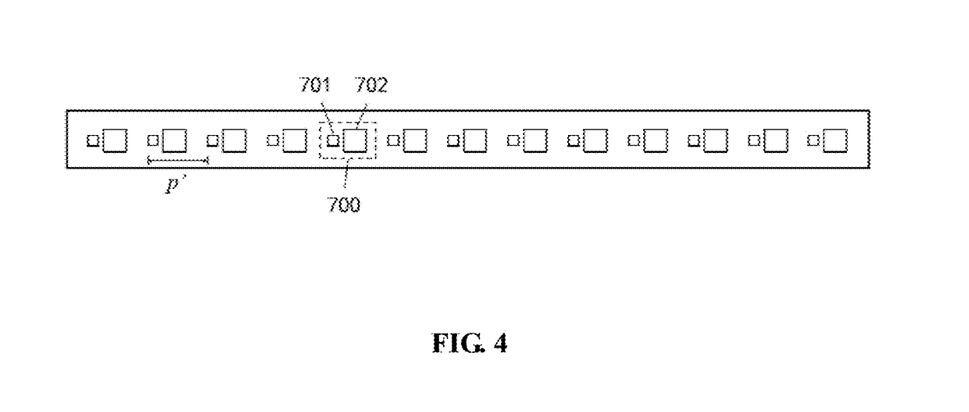
FIG. 4 shows the image plane test mark in the first embodiment of the present invention.

In the first embodiment as shown in FIG. 2, the multi-channel point device for measuring the distortion and magnification of the projection objective lens is based on a diffraction interference sensor 600. FIG. 3 shows the adopted test reticle 200. The test reticle 200 comprises 5×13 object plane test marks 300, the object plane test marks 300 are double pinhole marks, and each double pinhole mark comprises pinhole marks 301 and 302. The multi-channel point diffraction interference sensor 600 comprises 1×13 image plane test marks 700, 1×13 collimating lenses 601, and an flat-panel measurer 800. As shown in FIG. 4, each image plane test mark 700 comprises a pinhole mark 701 and an window 702, the front focal plane of the collimating lens 601 array is located on a plane where the image plane test marks 700 are located, and the flat-panel measurer 800 is a CCD. The photosensitive surface of the flat-panel measurer 800 is located at the back focal plane of the collimating lenses 601 array, the focal lengths of the thirteen collimating lenses 601 are equal, which is $f_1$, and $$f_1 < \frac{p'}{2NA},$$

so that the optical signals of different marks on the flat-panel measurer 800 of the multi-channel image plane sensor 600 do not interfere with each other.

The steps of testing the image placement shifts $(\Delta x_i, \Delta y_i)$ (I=1-5, I=1-13) of the object plane test marks 300 by using the multi-channel point diffraction interference sensor 600 are as follows.

The illumination system 100 is set to generate 26 ideal spherical waves after light emitted thereby passes through the first row of 13 double pinhole marks 300 on the test reticle 200; the ideal spherical waves are imaged by the projection objective lens 500 to form 26 measured wavefronts, and the wafer stage 900 is moved; when the pinhole marks 701 in the 13 image plane test marks 700 of the multi-channel point diffraction interference sensor 600 are aligned with the nominal imaging positions of the pinhole marks 302 in the first row of 13 double pinhole marks 300, the position $[X_I, Y_I, Z_I]$ (I=1) of the wafer stage 900 at this point is recorded; one path (13) of the 26 measured wavefronts is diffracted by the 13 pinhole marks 702 to form ideal spherical waves to be used as reference lights, and the other path (13) passes through the window 702 to be used as measurement lights; the 13 measurement lights and the 13 reference lights interfere and are collimated by the 13 collimating lenses 601 to form 13 interference fringes on the CCD 800, the interference fringes are analyzed to obtain the wavefront aberrations of 13 field points, and the alignment position deviation $(\delta x_i, \delta y_i, \delta z_i)$ of the 13 pinholes 302 is calculated according to the Zernike coefficients of $Z_2$-$Z_4$ terms of the measured 13 wavefront aberrations based on formula (4), $$\delta x_i = f_1 \times \frac{Z_2}{R_{sensor}} \qquad (4)$$

$$\delta y_i = f_1 \times \frac{Z_3}{R_{sensor}}$$

$$\delta z_i = -16 f_1 Z_4^2 / R_{sensor}^4,$$

where $R_{sensor}$ is the wavefront radius measured by the CCD 800, and the alignment deviation $(\delta x_i, \delta y_i, \delta z_i)$ is the position deviation between an actual image point of the 13 pinhole marks 302 in the first group and a reference point (the focal point of the collimating lens 601 of the point diffraction interference sensor 600); after calculating $(\delta x_i, \delta y_i, \delta z_i)$, the position of the reference point (the nominal imaging position $(x_i, y_i)$ of each pinhole mark plus the position $[X_i, Y_i]$ (I=1) of the wafer stage) is added to obtain the actual imaging point position $(x_{ri}, y_{ri}, z_{ri})$ of the first row of 13 pinhole marks 302; the nominal imaging position $(x_i, y_i)$ of the pinhole marker 302 is calculated by formula (2):

$$(x_i, y_i) = (xx_i, yy_i) \cdot M \qquad (2)$$

then the image placement shifts ($\Delta x_i$, $\Delta y_i$) (I=1, i=1-13) of the first row of 13 pinhole marks 302 are calculated according to formula (5)

$$(\Delta x_i, \Delta y_i) = (x_{ri}, y_{ri}) - (x_i, y_i) \tag{5}$$

the setting of the illumination system 100 is changed so that the light emitted thereby only illuminates the second row of 13 double pinhole marks 300, and the wafer stage 900 is moved to make the multi-channel point diffraction interference sensor 600 simultaneously measure the image placement shifts ($\Delta x_i$, $\Delta y_i$) (I=2, i=1-13) after the second row of 13 double pinhole marks 300 are imaged by the projection objective lens 500; and so on, until the image placement shifts ($\Delta x_i$, $\Delta y_i$) (I=1-5, i=1-13) of five rows of 65 double pinhole marks 300 are measured; the image placement shifts ($\Delta x_i$, $\Delta y_i$) (I=1-5, i=1-13) are fit according to the following formula:

$$\Delta x_i = T_{Ix} - \theta_I y_i + M_x x_i - k_1 x_i r_i^2 + r_x \tag{1}$$
$$\Delta y_i = T_{Iy} + \theta_I x_i + M_y y_i - k_1 y_i r_i^2 + r_y,$$

because the image placement shifts ($\Delta x_i$, $\Delta y_i$) in x and y directions are measured at the same time, the rotation errors $\theta_1$ of the wafer stage 900 are the same; there are 130 equations and 18 unknowns in the equation set: the positioning errors $T_{Ix}$, $T_{Iy}$, $\theta_I$ (I=1-5) of five groups of wafer stages 900, and the distortion and the magnification errors in x and y directions of the projection objective lens 500: $k_1$, $M_x$, $M_y$, which can be fitted by the least square method.

Figure 5:
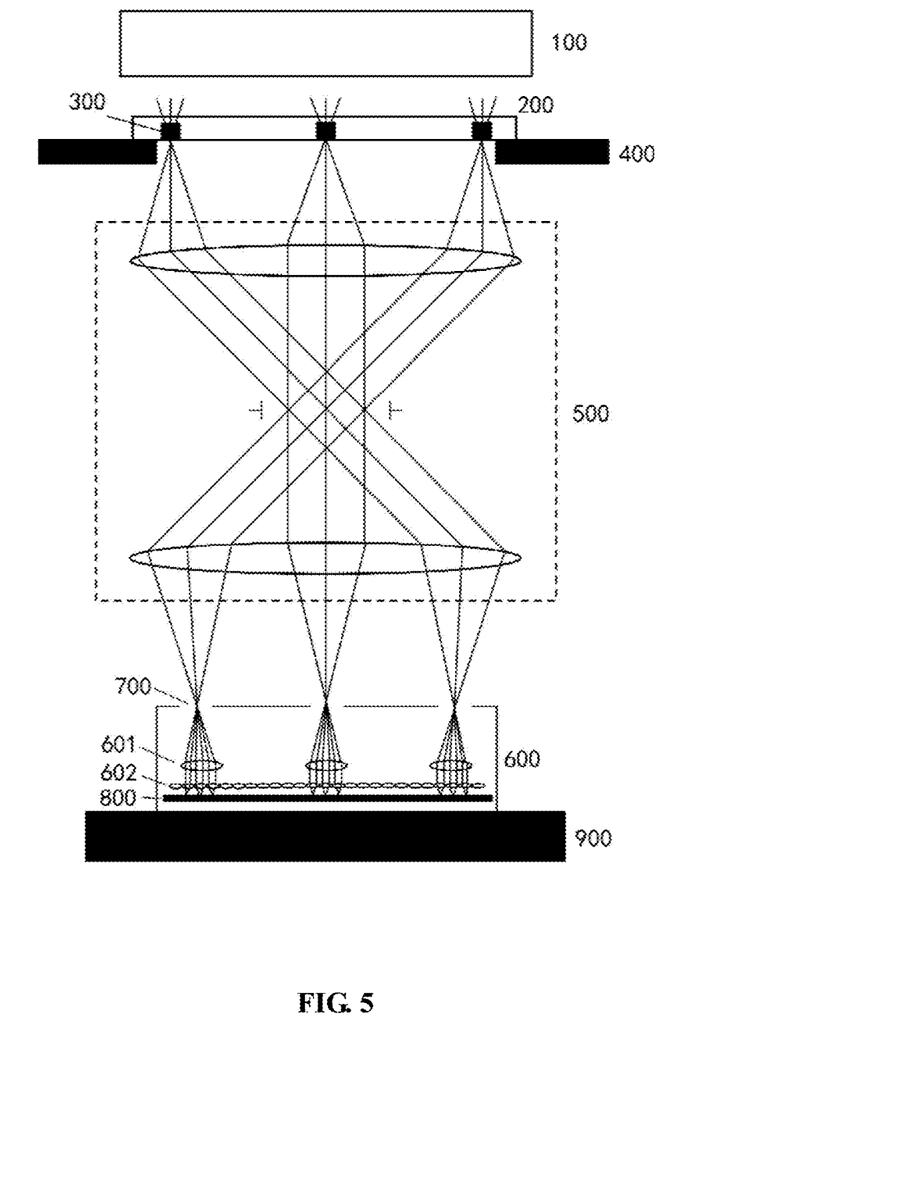
FIG. 5 shows the device for measuring the distortion and magnification of a projection objective lens based on a multi-channel Shack-Hartmann sensor in the second embodiment of the present invention.
Figure 6:
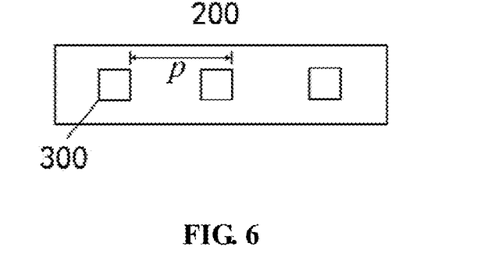
FIG. 6 shows the reticle in the second embodiment of the present invention.
Figure 7:
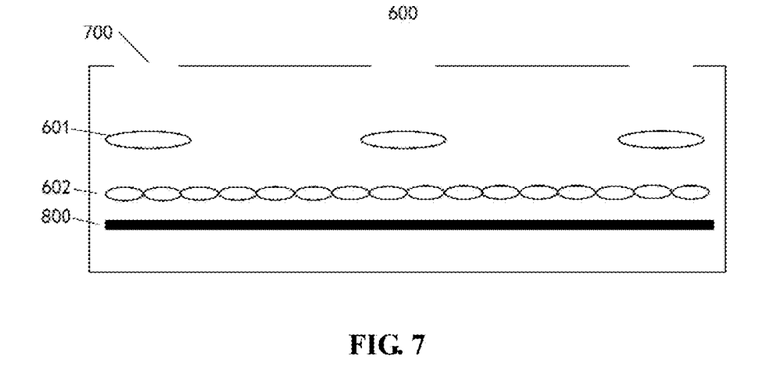
FIG. 7 shows the multi-channel Shack-Hartmann sensor in the second embodiment of the present invention.

In the second embodiment, FIG. 5 is a schematic diagram of a device for measuring the distortion and magnification of a projection objective lens 500 based on a multi-channel Shack-Hartmann sensor 600. The adopted test reticle 200 is shown in FIG. 6. The test reticle 200 comprises 1×3 object plane test marks 300, and the object plane test marks 300 are pinhole marks. As shown in FIG. 7, the multi-channel Shack-Hartmann sensor 600 comprises 1×3 collimating lens 601, a microlens array 602, a flat-panel measurer 800 and three image plane test marks 700, and the image plane test marks 700 are windows which are located on a front focal plane of the collimating lens 601 array and in conjugate relation with the object plane test marks 300; the flat-panel measurer 800 is a CMOS, the microlens array 602 is located on the back focal plane of the collimating lens 601 array, and the photosensitive surface of the flat-panel measurer 800 is located on the focal plane of the microlens array 602; and the focal lengths of the three collimating lenses 601 are equal, which is $f_2$, and $$f_2 < \frac{p'}{2NA},$$

so that the optical signals of different marks on the flat-panel measurer 800 of the multi-channel Shack-Hartmann sensor 600 do not interfere with each other.

The steps of testing the image placement shifts ($\Delta x_i$, $\Delta y_i$) (I=1, i=1-3) of the object plane test marks 300 by using the multi-channel Shack-Hartmann sensor 600 are as follows:

The light emitted by the illumination system 100 passes through three pinhole marks 300 to form three ideal spherical waves, which are imaged by the projection objective lens 500 to form three measured wavefronts, and the multi-channel Shack-Hartmann sensor 600 is moved until the three image plane test marks 700 and the nominal imaging positions of the three pinhole marks 300 are aligned; the three measured wavefronts are collimated by the three collimating lenses 601, each collimated wavefront is focused on the CMOS 800 by the microlens array 602 to form an image point array, and the wavefront aberrations of three field points are obtained by analyzing the coordinates of an image point array of the three pinhole marks 300; the alignment deviation ($\delta x_i$, $\delta y_i$, $\delta z_i$) and image placement shifts ($\Delta x_i$, $\Delta y_i$) (I=1, i=1-3) of the three pinhole marks 300 are calculated according to formulas (2), (4) and (5) based on the Zernike coefficients of $Z_2$-$Z_4$ terms of the measured three wavefront aberrations, where $f_1$ in the formula (4) is replaced by $f_2$; the alignment deviation is the position deviation between the actual image point of each pinhole mark 300 and the reference point (the focal point of the collimating lens 601 array of the Shack-Hartmann wavefront sensor 600); and the image placement shifts ($\Delta x_i$, $\Delta y_i$) (I=1, i=1-3) is fitted according to the following formula:

$$\Delta x_i = T_{Ix} - \theta_I y_i + M_x x_i - k_1 x_i r_i^2 + r_x \tag{1}$$
$$\Delta y_i = T_{Iy} + \theta_I x_i + M_y y_i - k_1 y_i r_i^2 + r_y,$$

because the image placement shifts ($\Delta x_i$, $\Delta y_i$) in x and y directions are measured at the same time, the rotation errors $\theta_1$ of the wafer stage 900 are the same; there are six equations and six unknowns in the fitted formula: the positioning errors $T_{Ix}$, $T_{Iy}$, $\theta_I$ of the wafer stages 900, and the distortion and the magnification errors in x and y directions of the projection objective lens 500: k1, Mx, My, which can be fitted by the least square method.

Figure 8:
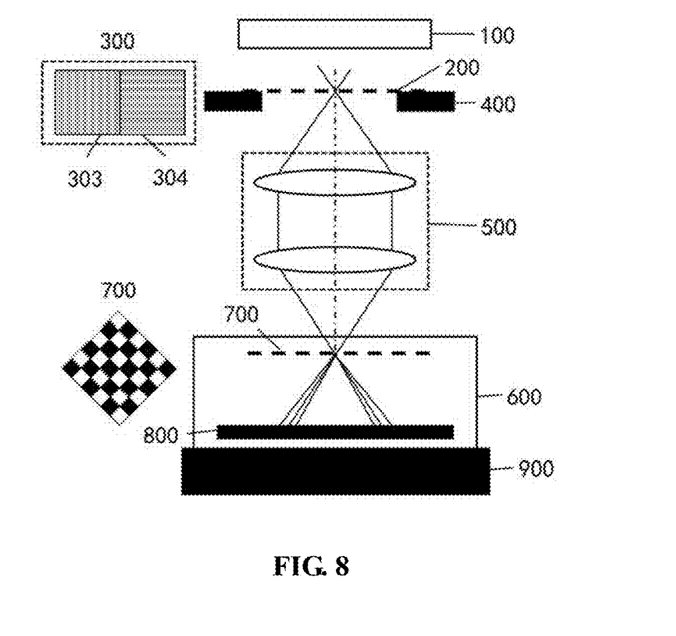
FIG. 8 shows the device for measuring the distortion and magnification of a projection objective lens based on a multi-channel shearing interference wavefront sensor in the third embodiment of the present invention.

In the third embodiment, FIG. 8 is the schematic diagram of the device for measuring the distortion and magnification of the projection objective lens 500 based on a multi-channel shearing interference sensor 600. The multi-channel shearing interference sensor 600 comprises 1×4 image plane test marks 700 and an flat-panel measurer 800, and the test reticle 200 contains 1×4 object plane test marks 300; each object plane test mark 300 comprises two one-dimensional gratings 303 and 304 in orthogonal directions, namely the first direction and the second direction, the one-dimensional gratings in the first direction and the second direction are used to measure the image placement shifts in the x direction and the y direction respectively, and the two directions share the same grating size and grating period; the image plane test marks 700 are checkerboard gratings, the checkerboard gratings 700 are located at a position in conjugate relation with the object plane test marks 300, and the flat-panel measurer is a CCD; the image plane test marks 700 and the flat-panel measurer 800 are arranged along the light transmission direction in turn; and the distance between the plane where the image plane test marks 700 are located and the photosensitive surface of the flat-panel measurer 800 is $$q, q < \frac{p'}{2NA},$$

so that the optical signals of different marks on the flat-panel measurer 800 of the multi-channel shearing interference plane sensor 600 do not interfere with each other.

The steps of testing the image placement shifts by using the multi-channel shearing interference wavefront sensor 600 are as follows:

(a) testing four first-direction interference images to obtain a differential wavefront: the wafer stage is moved to align the four checkerboard gratings 700 with the nominal imaging positions of the first-direction one-dimensional gratings 303 in the four object plane test marks 300, and the position [$X_{f1}$, $Y_{f1}$] of the wafer stage at this point is recorded; an incoherent light source uniformly illuminates the four first-direction one-dimensional gratings 303 on an object plane; the one-dimensional grating 300 modulates the spatial coherence of a light field and enables the pupil of the projection objective lens 500 to be uniformly illuminated; the checkerboard gratings 700 are used as beam splitting elements to make each diffraction order dislocated, four shearing interference images in the first direction are formed on the CCD 800 after diffraction light of the 0<th> order interferes with diffraction light of other odd orders, and no interference occurs among other diffraction orders; a phase shift algorithm is used to solve the four first-direction interference images to obtain a differential wavefront;

(b) testing four second-direction interference images to obtain a differential wavefront: the wafer stage is moved to align the four checkerboard gratings with the nominal imaging positions of four second-direction gratings 304, and the position [$X_{f2}$, $Y_{f2}$] of the wafer stage at this point is recorded; four second-direction shearing interference images are formed on the CCD 800; a phase shift algorithm is used to solve the four second-direction interference images to obtain a differential wavefront;

(c) calculating the image placement shifts ($\Delta x_i$, $\Delta y_i$) (I=1, i=1-4) of the four object plane test marks 300: the wavefront aberration of the measured projection objective lens 500 is obtained by wavefront reconstruction, the distortion is obtained from the Zernike coefficients of the $Z_2$-$Z_3$ terms, and the alignment position deviation ($\delta x_i$, $\delta y_i$) (I=1, i=1-4) based on the shearing interference is calculated by the formula (6):

$$\delta x_i = \frac{a_2 s}{\lambda} \times P \quad (6)$$
$$\delta y_i = \frac{a_3 s}{\lambda} \times P$$

the alignment position deviation $\delta x_i$, $\delta y_i$ is the deviation between the positions of the four checkerboard gratings 700 and the actual imaging positions of the four object plane test marks 300, where P is the period of the checkerboard gratings, a2, a3 are the Zernike coefficients of the $Z_2$-$Z_3$ terms, the unit is wavelength $\lambda$, and s is the normalized shear amount; the positions [$X_{f1}$, $Y_{f1}$] (I=1) and [$X_{f2}$, $Y_{f2}$] (I=1) of the wafer stage are added with the nominal imaging positions ($x_i$, $y_i$) of the first group of G object plane test marks to obtain the actual imaging positions ($x_{ri}$, $y_{ri}$) of the four object plane test marks 300; the image placement shifts ($\Delta x_i$, $\Delta y_i$) (I=1, i=1–G) of the four object plane test marks 300 are calculated according to formula (5);

Fitting of the image placement shifts ($\Delta x_i$, $\Delta y_i$) (I=1, i=1-4) is conducted according to the following formula (1):

$$\Delta x_i = T_{Ix} - \theta_{Ix} y_i + M_x x_i - k_1 x_i r_i^2 + r_x \quad (1)$$
$$\Delta y_i = T_{Iy} + \theta_{Iy} x_i + M_y y_i - k_1 y_i r_i^2 + r_y,$$

where $T_{Ix}$, $T_{Iy}$ are the translation errors of the wafer stage 900 when the four chessboard gratings 700 are aligned with the four first-direction one-dimensional gratings 301 and second-direction one-dimensional gratings 302 respectively, and $\theta_{Ix}$ and $\theta_{Iy}$ are the rotation errors of the wafer stage 900 when the four chessboard gratings 700 are aligned with the four first-direction one-dimensional gratings 301 and second-direction one-dimensional gratings 302 respectively. The four object plane test marks 300 generate eight equations, and the number of unknowns is seven: the positioning errors $T_{Ix}$, $\theta_{Ix}$, $T_{Iy}$, $\theta_{Iy}$ of the wafer stages, and the distortion and the magnification errors in x and y directions of the projection objective lens 500: $k_1$, $M_x$, $M_y$, which can be fitted by the least square method.

The matters not mentioned in the present invention are known technologies.

The above embodiments are only for explaining the technical concept and characteristics of the invention, and their purpose is to enable those familiar with the art to understand the content of the invention and implement the invention accordingly, but not to limit the scope of protection of the invention. All equivalent transformations or modifications made according to the spirit of the invention should be covered within the scope of protection of the invention.

We claim:

1. A multi-channel device for measuring distortion and magnification of objective lens, comprising
    an illumination system (100),
    a reticle stage (400),
    a test reticle (200),
    a projection objective lens (500),
    a sensor (600), and
    a wafer stage (900),
    wherein the illumination system (100) provides a light source;
    the reticle stage (400) bears the test reticle (200);
    the test reticle (200) is engraved with N number of object plane test marks, and the object plane test marks are divided into A number of groups, each group has G number of object plane test marks, A>=1, G>=3, and N>=3, the G number of object plane test marks in each group have the same spacing p and spatial distribution and are arranged along a straight line, a broken line, or into an array according to the spacing p, the spacing between different groups is >=p, and the object plane test marks (300) are all located in the object field of the projection objective lens (500) to be tested;
    the projection objective lens (500) is used for imaging the object plane test marks (300);
    the sensor (600) is a multi-channel image plane sensor for simultaneously measuring the image placement shifts between actual image points and nominal image points after the plurality of object plane test marks (300) are imaged by the projection objective lens (500);
    the multi-channel image plane sensor further comprises a group of G number of image plane test marks (700) in conjugate relation with a group of the G number of object plane test marks, and an flat-panel measurer (800), and the spacing p' between the image plane test marks (700) is equal to M×p, where M is the nominal reduction magnification of the projection objective lens (500); and
    the image plane test marks (700) and the flat-panel measurer (800) are sequentially placed along the light transmission direction, the divergent light transmission distance between the photosensitive surface of the flat-panel measurer (800) and a plane where the image plane test marks (700) are located is $$q, q < \frac{p'}{2NA}$$

so that optical signals of different marks on the flat-panel measurer (800) of the multi-channel image plane sensor (600) do not interfere with each other, and NA is the image space numerical aperture of the projection objective lens (500).

2. The device for measuring distortion and magnification of the multi-channel objective lens according to claim 1, wherein each object plane test mark (300) comprises two pinhole marks (301 and 302);

the multi-channel image plane sensor (600) is a multi-channel point diffraction interference sensor comprising G number of image plane test marks (700), a collimating lens array and the flat-panel measurer (800), and the image plane test mark (700) comprises a pinhole mark (701) and an window (702);

the collimating lens array comprises G number of collimating lenses (601), and the front focal plane of the collimating lens array is located on the plane where the image plane test marks (700) are located; and the flat-panel measurer (800) is a CCD, the photosensitive surface of the flat-panel measurer (800) is located on the back focal plane of the collimating lens array, the focal lengths of the G number of collimating lenses (601) are equal and being $f_1$ and defined as $$f_1 < \frac{p'}{2NA},$$

so that the optical signals of different marks on the flat-panel measurer (800) of the multi-channel image sensor (600) do not interfere with each other.

3. The device for measuring distortion and magnification of the multi-channel objective lens according to claim 1, wherein each object plane test mark (300) is a pinhole mark;

the multi-channel image plane sensor (600) is a multi-channel Shack-Hartmann sensor comprising the image plane test marks (700), a collimating lens array, a microlens array (602) and the flat-panel measurer (800);

the image plane test marks (700) are windows, the collimating lens array comprises G number of collimating lenses (601), and the front focal plane of the collimating lens array is located on the plane in conjugate relation with the object plane test marks (300);

the flat-panel measurer (800) is a CMOS, the microlens array (602) is located on the back focal plane of the collimating lens array, and the photosensitive surface of the flat-panel measurer (800) is located on a focal plane of the microlens array (602); and the focal lengths of the G collimating lenses (601) are equal, which is $f_2$, and $$f_2 < \frac{p'}{2NA},$$

so that the optical signals of different marks on the flat-panel measurer (800) of the multi-channel image sensor (600) do not interfere with each other.

4. The multi-channel device for measuring distortion and magnification of the objective lens according to claim 1, wherein the object plane test mark (300) comprises two one-dimensional gratings (303, 304) in orthogonal directions of a first direction and a second direction, and the first and second directions share the same grating size and grating period;

the multi-channel image plane sensor (600) is a multi-channel shearing interference sensor comprising the image plane test marks (700) and the flat-panel measurer (800), the image plane test marks (700) are checkerboard gratings and located on the plane in conjugate relation with the object plane test marks (300), and the flat-panel measurer (800) is a CCD; and the image plane test marks (700) and the flat-panel measurer (800) are sequentially placed along the light transmission direction, and the divergent light transmission distance between the photosensitive surface of the flat-panel measurer (800) and the plane where the image plane test marks (700) are located is q being defined as $$q < \frac{p'}{2NA}$$

so that the optical signals of different marks on the flat-panel measurer (800) of the multi-channel image plane sensor (600) do not interfere with each other.

5. A multi-channel method for measuring distortion and magnification of the objective lens using the device of claim 1, comprising (i) mounting the test reticle (200) on the reticle stage (400) and moving the object plane test marks (300) into the field of the projection objective lens (500);

(ii) mounting the multi-channel image plane sensor (600) on the wafer stage (900) and moving it to the plane in conjugate relation with the object plane test marks (300);

(iii) using the illumination system (100) to image the object plane test marks (300) through the projection objective lens (500), using the multi-channel image plane sensor (600) to simultaneously measure the image placement shifts ($\Delta x_i$, $\Delta y_i$) after the first group of G object plane test marks (300) are imaged by the projection objective lens (500), and changing the position of the test field point after testing the image placement shifts of the group of G channels until the image placement shifts ($\Delta x_i$, $\Delta y_i$) of the group A of object surface test marks (300) are measured; and (iv) calculating the distortion and magnification errors of the projection objective lens by conducting least square fitting on ($\Delta x_i$, $\Delta y_i$), wherein the fitting equation is:

$$\Delta x_i = T_{Ix} - \theta_{Ix} y_i + M_x x_i - k_1 x_i r_i^2 + r_x \qquad (1)$$
$$\Delta y_i = T_{Iy} + \theta_{Iy} x_i + M_y y_i - k_1 y_i r_i^2 + r_y$$

$T_{Ix}$ and $T_{Iy}$ are the translation errors of the wafer stage (900) when the multi-channel image plane sensor (600) is used to measure the x-direction and y-direction image placement shifts of the I<th> (I=1, 2 . . . A) group of object plane test marks (300) respectively, $\theta_{Ix}$ and $\theta_{Iy}$ are the rotation errors of the wafer stage (900) when the multi-channel image plane sensor (600) is used to measure the x-direction and y-direction image placement shifts of the I<th> (I=1, 2 . . . A) group of object plane test marks (300) respectively, $M_x$ and $M_y$ are the magnification errors of the projection objective lens (500) in x and y directions, $r_i=\sqrt{x_i^2+y_i^2}$ is the distance from a nominal imaging position of the i<th> object surface test mark (300) to a center of an image plane coordinate system, $k_1$ is the third-order distortion coefficient of the projection objective lens (500), $r_x$ and $r_y$ are fitting residuals, (xi, yi) is the nominal imaging position of the i<th> (i=1, 2 . . . G) object surface test mark (300) in the I<th> group, and the formula (2) is as follows:

$$(x_i, y_i) = (xx_i, yy_i) \cdot M \tag{2}$$

$(xx_i, yy_i)$ is the position of the object surface test mark (300) in an object plane coordinate system.

6. The method of claim 5, wherein in step (iii), changing the position of the test field point is conducted by the following steps:

when the test reticle (200) only contains one group of G object plane test marks (300), moving the reticle stage (400) to make the light emitted by the illumination system (100) image the G object plane test marks (300) through the projection objective lens (500), and moving the wafer stage (900) to make the multi-channel image plane sensor (600) simultaneously measure the image placement shifts $(xx_i, yy_i)$ after the G object plane test marks (300) are imaged by the projection objective lens (500);

moving the reticle stage (400) to change the position of a field point where the object plane test marks (300) are located, and moving the wafer stage (900) to make the multi-channel image plane sensor (600) simultaneously measure the image placement shifts $(xx_i, yy_i)$ again after the G object plane test marks (300) are imaged by the projection objective lens (500); and so on, until the image placement shifts $(xx_i, yy_i)$ of the object plane test marks (300) at all field points are measured; and when the test reticle (200) contains A groups of object plane test marks (300) with G object plane test marks in each group, setting the illumination system (100) such that the illumination light emitted by the illumination system only illuminates a first group of G object plane test marks (300) and images the same through the projection objective lens (500), and moving the wafer stage (900) to make the multi-channel image plane sensor (600) simultaneously measure the image placement shifts $(xx_i, yy_i)$ after the first group of G object plane test marks (300) are imaged by the projection objective lens (500);

changing the setting of the illumination system (100) so that the illumination light emitted by the illumination system only illuminates a second group of G object plane test marks (300), and moving the wafer stage (900) to make the multi-channel image plane sensor (600) simultaneously measure the image placement shifts $(xx_i, yy_i)$ after the second group of G object plane test marks (300) are imaged by the projection objective lens (500);

and so on, until the image placement shifts $(xx_i, yy_i)$ of N object plane test marks (300) which are divided into A groups are measured.

7. The method of claim 5, wherein the object plane test mark (300) is a double pinhole mark, the multi-channel image plane sensor (600) is a multi-channel point diffraction interference sensor, and in step (iii), measuring the image placement shift is conducted as follows:

the illumination light source (100) generates 2G ideal spherical waves after passing through the first group of G double pinhole marks on the test reticle (200), the ideal spherical waves are imaged by the projection objective lens (500) to form 2G measured wavefronts, and the wafer stage (900) is moved;

when the G image space pinhole marks (701) of the multi-channel point diffraction interference sensor (900) are approximately aligned with the nominal imaging positions of the G object plane pinholes (302), the position $[X_I, Y_I]$ (I=1) of the wafer stage (900) at this point is recorded;

one path (G) of the 2G measured wavefronts is diffracted by the G image plane pinhole marks (701) to form ideal spherical waves to be used as reference lights, and one path (G) passes through the window (702) to be used as measurement lights;

the G measurement lights and the G reference lights interfere and are collimated by the G collimating lenses (601) to form G interference fringes on the CCD (800), the interference fringes are analyzed to obtain the wavefront aberrations of a first group of G field points, and the alignment position deviation $(\delta x_i, \delta y_i, \delta z_i)$ of a first group of G pinholes (302) is calculated according to the Zernike coefficients of Z2-Z4 terms of the measured G wavefront aberrations, $$\delta x_i = f_1 \times \frac{Z_2}{R_{sensor}} \tag{4}$$
$$\delta y_i = f_1 \times \frac{Z_3}{R_{sensor}}$$
$$\delta z_i = -16 f_1 Z_4^2 / R_{sensor}^4,$$

where $R_{sensor}$ is the wavefront radius measured by the CCD (800), and $(\delta x_i, \delta y_i, \delta z_i)$ is the position deviation between an actual image point of each pinhole mark (302) in the first group and a reference point (a focal point of the collimating lens (601) of the point diffraction interference sensor);

after calculating $(\delta x_i, \delta y_i, \delta z_i)$, the position of the reference point (the nominal imaging position $(x_i, y_i)$ of each pinhole mark (302) plus the position $[X_I, Y_I]$ (I=1) of the wafer stage (900)) is added to obtain the actual imaging point position $(x_{ri}, y_{ri}, z_{ri})$ of each pinhole mark (302);

the nominal imaging position $(x_i, y_i)$ of the object plane pinhole marker (300) is calculated by formula (2), then the formula for calculating the image placement shifts $(\Delta x_i, \Delta y_i)$ (I=1, i=1–G) of the first group of G object surface pinhole markers (300) is $$(\Delta x_i, \Delta y_i) = (x_{ri}, y_{ri}) - (x_i, y_i) \tag{5}$$

the field is moved to measure the image placement shifts $(\Delta x_i, \Delta y_i)$ (I=2, i=1–G) of the next group of object plane pinholes (302) according to the above method until the image placement shifts $(\Delta x_i, \Delta y_i)$ (I=1–A) of N object plane test marks (300) which are divided into A groups are measured.

8. The method of claim 5, wherein the object plane test mark (300) is a single pinhole mark, the multi-channel image plane sensor (600) is a multi-channel Shack-Hartmann sensor, and in step (iii), measuring the image placement shift is conducted as follows:

the light emitted by the illumination system (100) passes through the first group of G object plane test marks (300) to form G ideal spherical waves, which are imaged by the projection objective lens (500) to form G measured wavefronts, and the multi-channel Shack-Hartmann sensor is moved until the front focal points of the G collimating lenses (601) and the nominal imaging positions of the G object plane test marks (300) are aligned;

the G measured wavefronts are collimated by the G collimating lenses (601) in the multi-channel Shack-Hartmann wavefront sensor, each collimated wavefront is focused on the CMOS by the microlens array (602) to form an image point array, and the wavefront aberrations of G field points are obtained by analyzing the coordinates of an image point array of the G field points;

the alignment position deviation ($\delta x_i$, $\delta y_i$, $\delta z_i$) and image placement shifts ($\Delta x_i$, $\Delta y_i$) (I=1, i=1–G) of the first group of G pinholes are calculated according to formulas (2), (4) and (5) based on the Zernike coefficients of Z2-Z4 terms of the measured G wavefront aberrations, where $f_1$ in the formula (4) is replaced by $f_2$;

the alignment position deviation is the position deviation between an actual image point of each pinhole mark in the first group and a reference point (a focal point of the collimating lens (601) of the Shack-Hartmann wavefront sensor); and the image placement shifts ($\Delta x_i$, $\Delta y_i$) (I=2, i=1–G) of the next group of object plane test marks (300) are measured according to the above method until the image placement shifts ($\Delta x_i$, $\Delta y_i$) (I=1–A, i=1–G) of N object plane test marks (300) which are divided into A groups are measured.

9. The method of claim 5, wherein the object plane test mark (300) is a one-dimensional grating, the multi-channel image plane sensor (600) is a multi-channel shearing interference sensor, and in step (iii), measuring the image placement shift is conducted as follows:

the wafer stage (900) is moved to align the G checkerboard gratings (700) with the nominal imaging positions of G first-direction one-dimensional gratings (301) in the first group of object plane gratings (300), the position [$X_{f1}$, $Y_{f1}$] (I=1) of the wafer stage (900) at this point is recorded, and an incoherent light source uniformly illuminates the G one-dimensional grating (301) arrays in the first direction on an object plane;

the one-dimensional grating (300) modulates the spatial coherence of a light field and enables a pupil of the projection objective lens (500) to be uniformly illuminated;

the checkerboard gratings (700) on an image plane are used as beam splitting elements to make each diffraction order dislocated, G shearing interference images in the first direction are formed on the CCD (800) after diffraction light of the 0<th> order interferes with diffraction light of other odd orders, and no interference occurs among other diffraction orders;

the wafer stage (900) is moved so that the G checkerboard gratings (700) are aligned with the nominal imaging positions of a first group of G second-direction gratings (302), the position [$X_{f2}$, $Y_{f2}$] (I=1) of the wafer stage (900) at this point is recorded, and shearing interference images of the G second-direction gratings (330) are formed on the CCD (800);

a phase shift algorithm is used to solve the first group of G interference images in the first direction and G interference images in the second direction to obtain a differential wavefront, the wavefront aberration of the measured projection objective lens (500) is obtained by wavefront reconstruction, the distortion is obtained from the Zernike coefficients of the Z2-Z3 terms, and the alignment position deviation based on the shearing interference is calculated by the following formula:

$$\delta x_i = \frac{a_2 s}{\lambda} \times P \qquad (6)$$

$$\delta y_i = \frac{a_3 s}{\lambda} \times P,$$

the alignment deviation is the deviation between the positions of the G checkerboard gratings (700) and the actual imaging positions of the first group of G object plane test marks (300), where P is the period of the checkerboard gratings (700), a2, a3 are the Zernike coefficients of the Z2-Z3 terms, the unit is wavelength $\lambda$, and s is the normalized shear amount;

the positions [$X_{f1}$, $Y_{f1}$] (I=1) and [$X_{f2}$, $Y_{f2}$] (I=1) of the wafer stage (900) are added with the nominal imaging positions ($x_i$, $y_i$) of the first group of G object plane test marks (300) to obtain the actual imaging positions ($x_{ri}$, $y_{ri}$) of the first group of G object plane test marks (300);

the image placement shifts ($\Delta x_i$, $\Delta y_i$) (I=1, i=1–G) of the first group of G object plane test marks (300) are calculated according to formula (4); and the image placement shifts ($\Delta x_i$, $\Delta y_i$) (I=2, i=1–G) of the next group of object plane test marks (300) are measured according to the above method until the image placement shifts ($\Delta x_i$, $\Delta y_i$) (I=1–A, i=1–G) of N object plane test marks (300) which are divided into A groups are measured.

\* \* \* \* \*